United States Patent
Park et al.

(10) Patent No.: US 9,484,876 B2
(45) Date of Patent: Nov. 1, 2016

(54) CONTROL OF A SWITCHED MODE POWER SUPPLY AND LINEAR POWER SUPPLY FOR AN AUDIO DEVICE

(71) Applicant: SAMSUNG ELECTRONICS CO., LTD., Suwon-si (KR)

(72) Inventors: Hae-kwang Park, Suwon-si (KR); Dong-hyun Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 367 days.

(21) Appl. No.: 14/012,203

(22) Filed: Aug. 28, 2013

(65) Prior Publication Data

US 2014/0064518 A1 Mar. 6, 2014

Related U.S. Application Data

(60) Provisional application No. 61/693,961, filed on Aug. 28, 2012.

(30) Foreign Application Priority Data

Apr. 30, 2013 (KR) ........................ 10-2013-0048530

(51) Int. Cl.
*H03G 3/00* (2006.01)
*H03G 3/20* (2006.01)
(Continued)

(52) U.S. Cl.
CPC .............. *H03G 3/20* (2013.01); *H03F 1/025* (2013.01); *H03F 1/0227* (2013.01); *H03F 1/305* (2013.01);
(Continued)

(58) Field of Classification Search
CPC ..... H03G 3/20; H03F 1/305; H03F 2200/03; H03F 2200/102; H03F 2200/504; H03F 2200/507; H03F 2200/511
USPC ........................................ 381/104, 107, 120
See application file for complete search history.

(56) References Cited

U.S. PATENT DOCUMENTS 4,380,824 A * 4/1983 Inoue ............................. 455/143
4,696,036 A * 9/1987 Julstrom .......................... 381/22
(Continued)

FOREIGN PATENT DOCUMENTS

JP         2012135015 A    7/2012
KR    1020070043002 A    4/2007
(Continued)

OTHER PUBLICATIONS

Communication dated May 1, 2014, issued by the Korean Intellectual Property Office in counterpart Korean Application No. 10-2013-0048530.
(Continued)

*Primary Examiner* — Paul S Kim
*Assistant Examiner* — Katherine Faley
(74) *Attorney, Agent, or Firm* — Sughrue Mion, PLLC

(57) ABSTRACT

An audio device and an output method thereof are provided. The audio device includes: an envelope detector configured to detect an envelope of an input audio signal; a power supply which includes a linear power supply (LPS) and a switching-mode power supply (SMPS); an amplifier configured to amplify the input audio signal; an output unit configured to output the audio signal amplified by the amplifier; and a controller configured to compare a voltage level of the detected envelope with a preset level, select one of the LPS and the SMPS based on a result of the comparison, and control the power supply to supply power from the selected one of the LPS and the SMPS to the amplifier.

8 Claims, 8 Drawing Sheets

(51) Int. Cl.
  *H03F 1/02* (2006.01)
  *H03F 1/30* (2006.01)
  *H03F 3/181* (2006.01)
  *H03G 3/30* (2006.01)

(52) U.S. Cl.
  CPC ............ *H03F 3/181* (2013.01); *H03G 3/3005* (2013.01); *H03F 2200/03* (2013.01); *H03F 2200/102* (2013.01); *H03F 2200/504* (2013.01); *H03F 2200/507* (2013.01); *H03F 2200/511* (2013.01)

(56) References Cited

U.S. PATENT DOCUMENTS

| | | |
|---|---|---|
| 2008/0012639 A1 | 1/2008 | Mels |
| 2009/0184764 A1 | 7/2009 | Markowski et al. |
| 2009/0220110 A1 | 9/2009 | Bazarjani et al. |
| 2009/0278609 A1 | 11/2009 | Srinivasan et al. |
| 2011/0221533 A1 | 9/2011 | Lesso |
| 2012/0235738 A1* | 9/2012 | Masuda et al. ............... 330/127 |

FOREIGN PATENT DOCUMENTS

| | | |
|---|---|---|
| WO | 2006/018750 A1 | 2/2006 |
| WO | 2008/105073 A1 | 9/2008 |
| WO | 2011/115533 A1 | 9/2011 |

OTHER PUBLICATIONS

Communication dated Oct. 11, 2013, issued by the European Patent Office in corresponding Application No. 13181186.1.
Communication dated Aug. 18, 2015, issued by the European Patent Office in counterpart European Application No. 13181186.1.
Communication issued on Jan. 27, 2016 by the European Patent Office in counterpart European Application No. 13181186.1.
Communication dated Jul. 5, 2016, issued by the European Patent Office in counterpart European Application No. 13181186.1.

* cited by examiner (1)

(2)

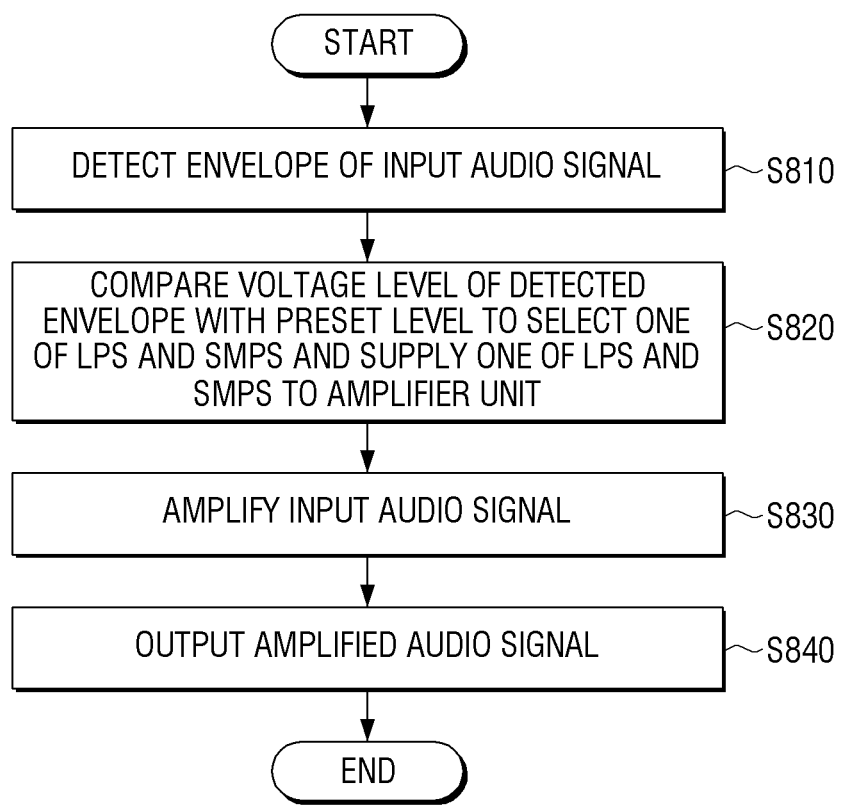

CONTROL OF A SWITCHED MODE POWER SUPPLY AND LINEAR POWER SUPPLY FOR AN AUDIO DEVICE

CROSS-REFERENCE TO RELATED APPLICATION(S)

This application claims priority under 35 U.S.C. §119 from U.S. Provisional Patent Application No. 61/693,961, filed on Aug. 28, 2012, United States Patent and Trademark Office, and Korean Patent Application No. 10-2013-0048530, filed on Apr. 30, 2013, in the Korean Intellectual Property Office, the disclosure of which is incorporated herein by reference, in its entirety.

BACKGROUND

1. Field

The exemplary embodiments generally relate providing an audio device and an output method thereof, and more particularly, to an audio device which selects a power supply according to a change of a sound source, and an output method thereof.

2. Description of the Related Art

An audio device amplifies an input audio signal to output the amplified audio signal through a speaker. Power having a level higher than or equal to a level of the audio signal is supplied to an amplifier that amplifies the audio signal.

A type of power supply may be classified as a linear power supply (LPS) and as a switching mode power supply (SMPS). In general, in the case of LPS, an output voltage has high noise and ripple characteristics, but the volume is relatively large, resulting in a large amount of heat being generated. Therefore, the LPS, in an actual design is limited by a maximum output due to its design. In the case of SMPS, the volume is low, and power efficiency is high in a high power state. However, a ripple characteristic generated by a switching pulse is relatively inferior to linear power.

In a home audio amplifier, dynamic changes of output energy are very large from a low output to a level having a high energy peak, according to the sound source. Accordingly, a technology for realizing an optimum sound quality and power efficiency in a low output area having a low energy level and a peak output area is required.

SUMMARY

Exemplary embodiments address at least the above problems and/or disadvantages and other disadvantages not described above. Also, the exemplary embodiments are not required to overcome the disadvantages described above, and an exemplary embodiment may not overcome any of the problems described above.

The exemplary embodiments provide an audio device which selects an appropriate power supply according to high and low changes of a sound source in order to implement optimum sound quality and high efficiency in an area having a low energy level and a peak output area, and an output method thereof.

According to an aspect of the exemplary embodiments, there is provided an audio device including: an envelope detector configured to detect an envelope of an input audio signal; a power supply which includes a linear power supply (LPS) and a switching-mode power supply (SMPS); an amplifier configured to amplify the input audio signal; an output unit configured to output the audio signal amplified by the amplifier; and a controller configured to compare a voltage level of the detected envelope with a preset level, select one of the LPS and the SMPS based on a result of the comparison, and control the power supply to supply power from the selected one of the LPS and the SMPS to the amplifier.

The audio device may further include a smoother configured to smooth an instantaneous change of a voltage level caused by changes of the LPS and the SMPS.

The audio device may further include a booster configured to boost the input audio signal.

The controller may select the LPS in response to the voltage level of the detected envelope being lower than or equal to the preset level and select the SMPS in response to the voltage level of the detected envelope being higher than or equal to the preset level.

The preset level may include a first level and a second level exceeding the first level. The controller may select the LPS in response to the voltage level of the detected envelope falling to be lower than or equal to the first level and may select the SMPS in response to the voltage level of the detected envelope rising to be higher than or equal to the second level.

The controller may be configured to set an output voltage level of the LPS to the first level at a time when the voltage level of the detected envelope falls to the first level, and set an output voltage level of the SMPS to the second level at a time when the voltage level of the detected envelope rises to the second level.

The power supply may be configured to adjust a voltage level of the selected LPS or SMPS to the voltage level of the detected envelope and output the adjusted voltage level.

According to another aspect of the exemplary embodiments, there is provided an output method of an audio device. The output method may include: detecting an envelope of an input audio signal; comparing a voltage level of the detected envelope with a preset level, selecting one of an LPS and an SMPS; amplifying the input audio signal by using power from the selected one of the LPS and the SMPS; and outputting the amplified audio signal.

The output method may further include: smoothing an instantaneous change of a voltage level caused by changes of the LPS and the SMPS.

The output method may further include: boosting the input audio signal.

In response to the voltage level of the detected envelope being lower than or equal to the preset level, the LPS may be selected. In response to the voltage level of the detected envelope being higher than or equal to the preset level, the SMPS may be selected.

The preset level may include a first level and a second level exceeding the first level. In response to the voltage level of the detected envelope falling to be lower than or equal to the first level, the LPS may be selected, and in response to the voltage level of the detected envelope rising to be higher than or equal to the second level, the SMPS may be selected.

The selecting of the LPS or the SMPS may include: setting an output voltage level of the LPS to the first level at a time when the voltage level of the detected envelope falls to the first level; and setting to an output voltage level of the SMPS to the second level at a time when the voltage level of the detected envelope rises to the second level.

The output method may further include: adjusting a voltage level of the selected LPS or SMPS to the voltage level of the detected envelope. Power may be supplied to an amplifier based on the adjusted voltage level in order to amplify the input audio signal.

As described above, according to various exemplary embodiments, an audio device may select an appropriate power supply according to an energy level of a sound source to implement an optimum sound quality and high efficiency.

BRIEF DESCRIPTION OF THE DRAWINGS

The above and/or other aspects will be more apparent by describing certain exemplary embodiments with reference to the accompanying drawings, in which:

FIG. 8 is a flowchart which illustrates an output method of an audio device according to an exemplary embodiment.

DETAILED DESCRIPTION OF THE EXEMPLARY EMBODIMENTS

Figure 1:
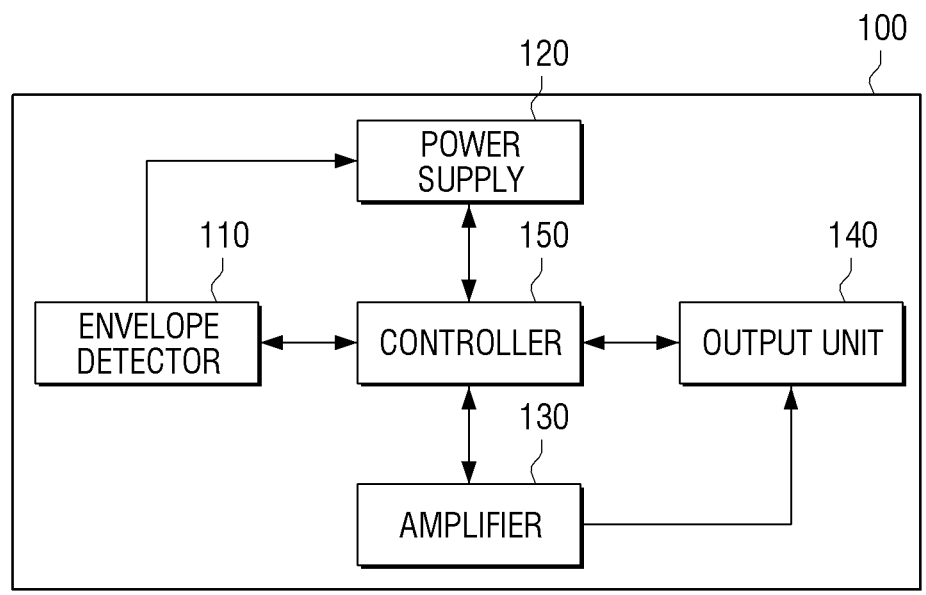
FIGS. 1 and 2 are block diagrams which illustrate an audio device according to an exemplary embodiment.

Exemplary embodiments are described in greater detail with reference to the accompanying drawings.

In the following description, the same drawing reference numerals are used for the same elements even in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, well-known functions or constructions are not described in detail since they would obscure the exemplary embodiments with unnecessary detail.

FIG. 1 is a block diagram which illustrates an audio device 100 according to an exemplary embodiment.

Referring to FIG. 1, the audio device 100 includes an envelope detector 110, a power supply 120, an amplifier 130, an output unit 140, and a controller 150.

The envelope detector 110 detects an envelope of an audio signal input into the audio device 100. In general, the envelope refers to a curve contacting a band of curves meeting a preset condition, i.e., an outline of the audio signal. The envelope detector 110 of the present exemplary embodiment 110 detects a curve having a predetermined size or more which is proportional to the outline of the audio signal not the curves contacting the audio signal. In response to an audio signal being input, the envelope detector 110 detects a dynamic characteristic of the audio signal and generates an envelope signal including an audio amplifier gain and power level information appropriate for an output level. Since changes of the audio signal are very serious, the envelope detector 110 generates the envelope signal to select and vary a power supply according to a change rate (a frequency) outside an audible band. Since the audible band is between 20 Hz and 20 kHz, the envelope signal may be detected as a signal having a frequency lower than 20 Hz.

The power supply 120 includes an LPS and an SMPS. One of the LPS and the SMPS of the power supply 120 is selected under the control of controller 150. The selected power source supplies power to the amplifier 130. The power supply 120 adjusts a power level so that the power level is proportional to a level change of the detected envelope, in order to supply the power to the amplifier 130.

The amplifier 130 amplifies the input audio signal, and the output unit 140 outputs the audio signal amplified by the amplifier 130.

The controller 150 compares a voltage level of the detected envelope with a preset level in order to select one of the LPS and the SMPS. In response to the voltage level of the detected envelope is lower than or equal to the preset level, the controller 150 may select the LPS. In response to the voltage level of the detected envelope being higher than or equal to the preset level, the controller 150 may select the SMPS. For example, the preset level may be set to a particular voltage value between 0.5 V and −0.5V. The preset level may also be set to one voltage value or two or more voltage values.

In response to a level of the input audio signal being higher than or equal to the preset level, the audio device 100 may supply power to the amplifier 130 by using the SMPS. The SMPS has a small volume and has high efficiency in a high output. The SMPS has a inferior ripple characteristic caused by a switching pulse to the LPS. In response to the level of the audio signal being high, a user may hardly feel noise caused by ripples. Therefore, the SMPS is appropriate for the high level of the audio signal.

In response to the level of the input audio signal being lower than or equal to the preset level, the audio device 100 may supply power to the amplifier 130 by using the LPS. The LPS has a great volume and is limited by a maximum output but has high noise and ripple characteristics. Therefore, the LPS is appropriate for a low level of the audio signal.

The audio device 100 may further include a booster 160 and a smoother 170.

Figure 2:
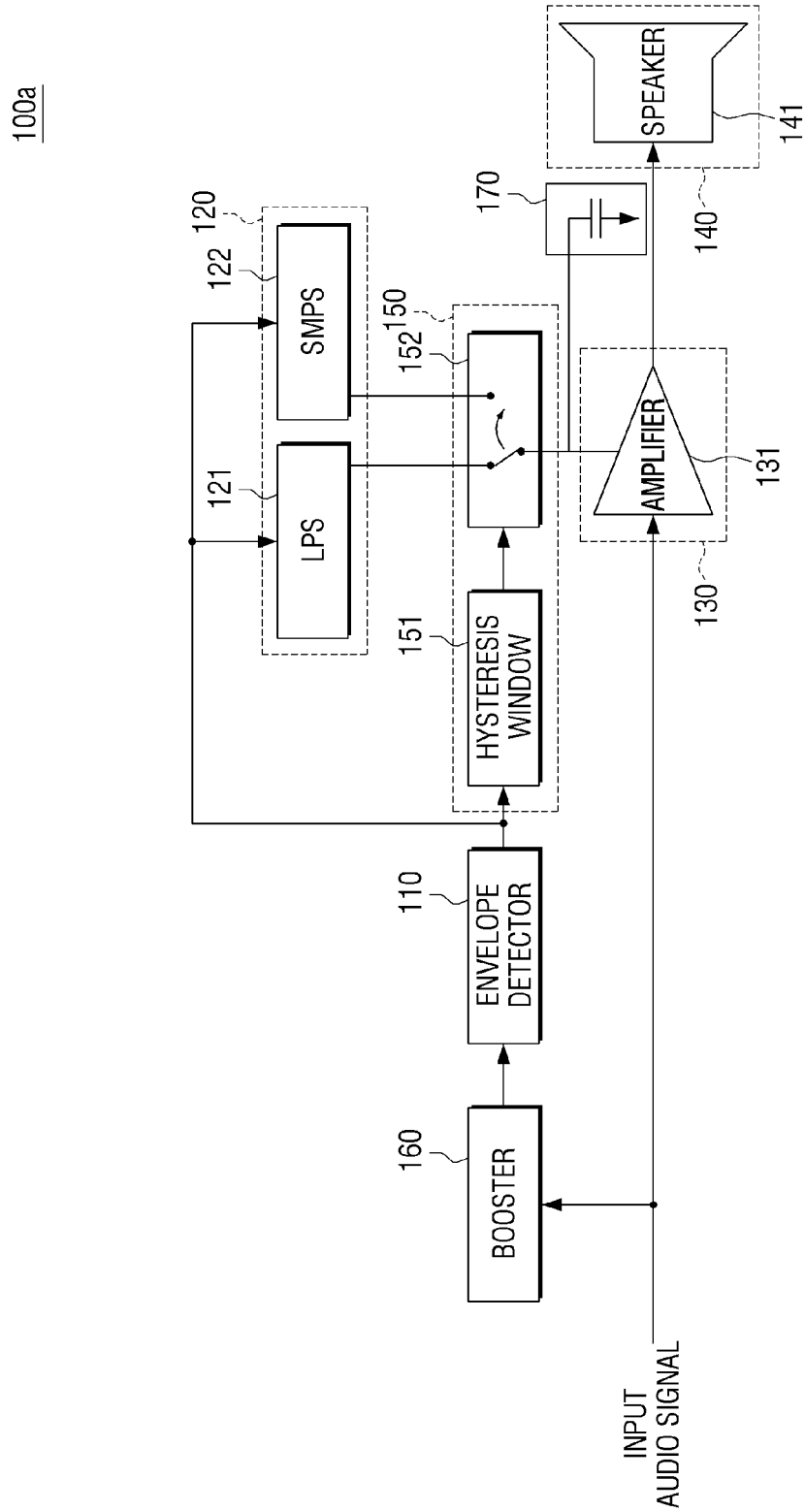

FIG. 2 is a block diagram illustrating an audio device 100a according to another exemplary embodiment. Referring to FIG. 2, the audio device 100a includes an envelope detector 110, a power supply 120, an amplifier 130, an output unit 140, a controller 150, the booster 160, and the smoother 170. The power supply 120 includes an LPS 121 and an SMPS 122, and the amplifier 130 includes an amplifier 131. The output unit 140 includes a speaker 141, and the controller 150 includes a hysteresis window 151 and a switch 152.

The booster 160 boosts an input audio signal by a preset level. The booster 160 is applied to an envelope. The smoother 170 smoothes an instant change of a voltage level caused by changes of the LPS and the SMPS. In response to the LPS being changed to the SMPS or the SMPS being changed to the LPS, power may not be instantaneously supplied to the amplifier 131. A section in which power is not supplied may be an instant, but a rapid up and/or down of the audio signal may generate pop-up noise. Therefore, the audio device 100 may include the smoother 170, not for the purpose of generating a section in which power is not supplied when a power supply is changed. A capacitive element may be connected to a power supply line input into the amplifier 131 and to a ground to implement the smoother 170. A value of the capacitive element may be determined in consideration of a circuit, a power supply change time, etc.

The LPS 121 refers to a power supply that supplies constant power through a process such as a transformation, a rectification, or the like. For example, there may be a Low Drop Out (LDO) power supply, a circuit may be constituted by using a voltage divider or by a zener diode using a resistance value. The SMPS 122 refers to a power supply that supplies constant power through switching or through a pulse control. An example of the SMPS 122 may include a DC-DC converter.

The hysteresis window 151 outputs a control signal that operates the LPS 121 or the SMPS 122, according to the envelope of the detected audio signal. The hysteresis window 151 applies a hysteresis window to prevent too frequent power supply changes with respect to frequent changes of the envelope. For example, the hysteresis window 151 may set a first level and a second level which exceeds the first level. In response to a voltage a level of the envelope being lower than or equal to the first level, the hysteresis window 151 outputs a signal for selecting the LPS 121. In response to the voltage level of the envelope being higher than or equal to the second level, the hysteresis window 151 outputs a signal for selecting the SMPS 122. Alternatively, in response to the voltage level of the envelope falls to be lower than or equal to the first level, the hysteresis window 151 may output a signal for selecting the LPS 121. In response to the voltage level of the envelope rising to be higher than or equal to the second level, the hysteresis window 151 may output a signal for selecting the SMPS 122.

The switch 152 selects the LPS 121 or the SMPS 122 according to the power supply selection signal output from the hysteresis window 151.

The envelope detector 110, the amplifier 130, and the output unit 140 are the same as those described with reference to FIG. 1. As described above, the audio signal is amplified through the amplifier 130 and then output through the output unit 140. The amplifier 130 is supplied with power from the power supply 120. In relation to a process of supplying power, the audio device 100 may boost the input audio signal by using the booster 160 to detect the envelope.

Figure 3:
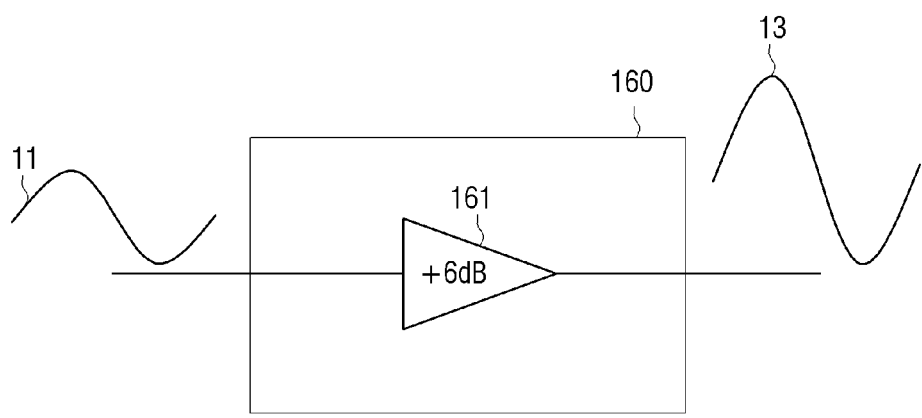
FIG. 3 is a view which illustrates a boosting process according to an exemplary embodiment.

FIG. 3 is a view which illustrates a boosting process according to an exemplary embodiment. The power supply 120 is pre-controlled to supply power having an appropriate level to the amplifier 130. The level of the supplied power is to be kept higher than a level of an audio signal which is to be output.

Referring to FIG. 3, an input audio signal 11 is input into the booster 160. The booster 160 includes an amplifier 161 that boosts the input audio signal to a preset level. The input audio signal 11 is boosted to the preset level through the amplifier 161 that performs boosting.

The input audio signal 11 and a boosted audio signal 13 have the same forms. However, since a change rate of the boosted audio signal 13 is higher than a change rate of the input audio signal 11, the boosted audio signal 13 may always have a higher value than the input audio signal 11. In other words, in response to an envelope being detected from the boosted audio signal 13, the envelope may be proportional to a change of the input audio signal 11 and may be greater than the amplitude of the input audio signal 11.

In the exemplary embodiment of FIG. 3, a boosting level is set to 6 dB. However, the boosting level may be set to an appropriate level according to a desired performance, etc. of the audio device 100. For example, in response to the performance of the audio device 100 being high, the boosting level may be set to 3 dB. In response to the performance of the audio device 100 being low, the boosting level may be set to 9 dB.

The boosted audio signal 13 is input into the envelope detector 110. The envelope detector 110 detects an envelope from the boosted audio signal 13 in order to select one of the LPS 121 and the SMPS 122. The controller 150 selects a power supply by using the detected envelope.

Figure 4:
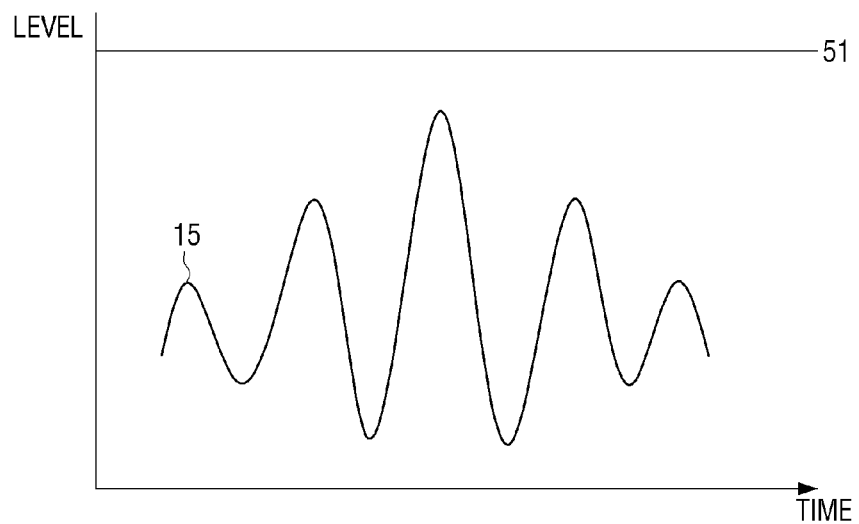
FIG. 4 is a view which illustrates a process of detecting an envelope according to an exemplary embodiment.
Figure 4:
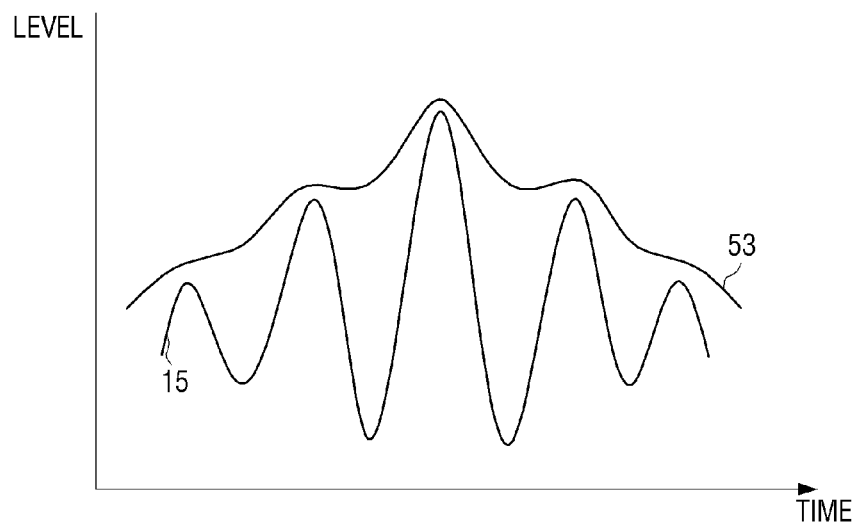

FIG. 4 is a view which illustrates a process of detecting an envelope according to an exemplary embodiment.

Referring to (1) of FIG. 4, an amplifier supply power level 51 and an output audio signal 15 are shown. The general amplifier supply power level 51 is fixed as a maximum output level of the audio device 100. A power level necessary for the amplifier is a level of the output audio signal 15. The audio device 100 supplies power through one power supply. Therefore, in response to the audio device 100 being supplied with power through an LPS, efficiency of the power may be low, and the power may be saturated on a peak level. In response to the audio device 100 being supplied with power through an SMPS, noise may be generated in an audio signal having a low level. Power exceeding the output audio signal 15 is consumed according to a parameter such as heat. Therefore, unnecessary power consumption occurs as a result of a difference between the output audio signal 15 and the amplifier supply power level 51.

Referring to (2) of FIG. 4, an envelope 53 is detected based on an output audio signal 15. Since changes of an audio signal are very serious, an envelope signal is generated to select or vary a power supply at a change rate (a frequency) outside of a visible band.

The controller 150 determines a type of power supply output to the amplifier 130 according to a level of the envelope signal, and the power supply 120 supplies power to the amplifier 130 by using the selected power supply. In response to the level of the envelope signal being higher than or equal to a preset level, the power supply 120 supplies power by using an SMPS. In response to the level of the envelope signal being lower than or equal to the preset level, the power supply 120 supplies power by using an LPS. Also, a level of power supplied to the amplifier 130 may be adjusted to be proportional to the level of the generated envelope signal.

In other words, the general amplifier supply power level 51 varies according to changes of the output audio signal 15, but is converted into a frequency outside the visible band. Therefore, the user may not sense changes in the general amplifier supply power level. Also, in response to the level of the envelope signal being higher than or equal to the preset level, power is supplied to the amplifier 130 by using the SMPS, and thus efficiency of the power is provided. In response to the level of the envelope signal is lower than or equal to the preset level, power being supplied by using an SMPS and thus provides a large amount of noise. Also, since the level of the supplied power is adjusted according to the changes of the output audio signal 15, power consumption of the audio device 100 may be reduced.

In response to the level of the envelope signal being detected to select a power supply, and there are many changes of the level of the envelope signal, switching of a change of the power supply increases. In response to the switching of the change of the power supply increasing, this may affect an audio signal, and thus power consumption increases. Therefore, the audio device 100 may use a hysteresis window.

Figure 5:
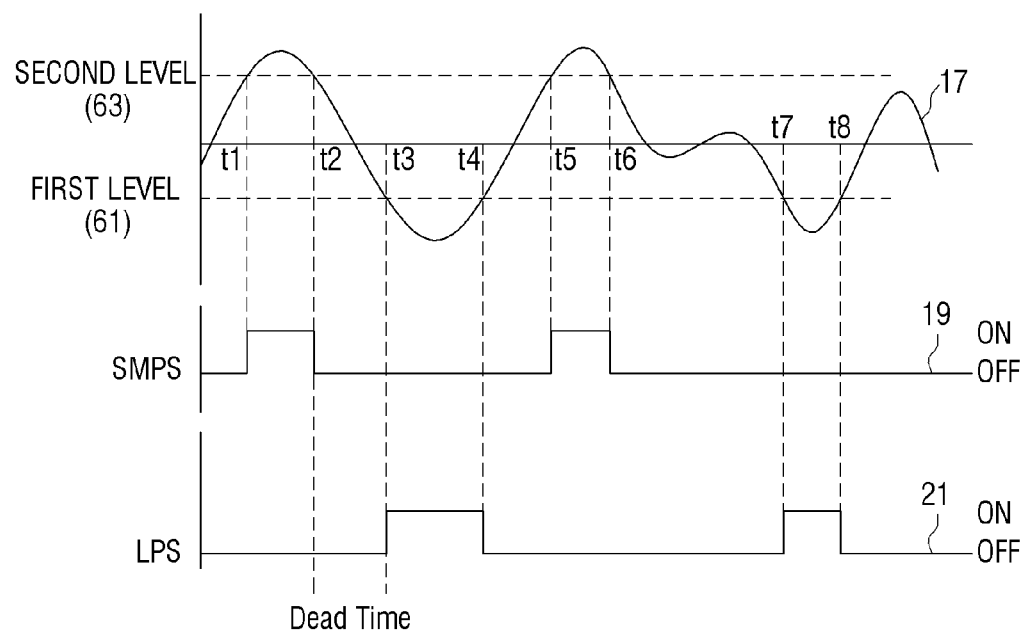
FIGS. 5 and 6 are views which illustrate a method of applying a hysteresis window to select a power supply according to an exemplary embodiment.
Figure 6:
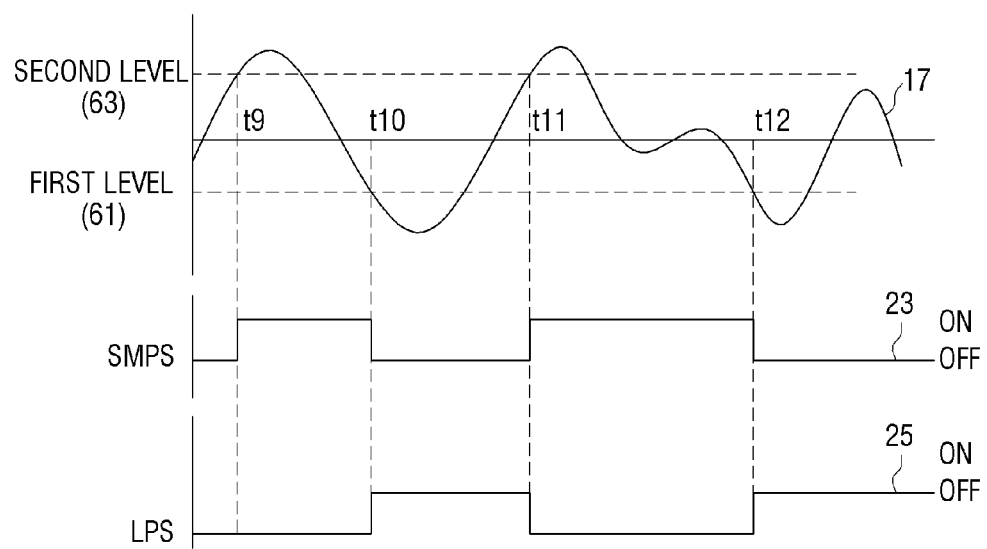

FIGS. 5 and 6 are views which illustrate a method of applying a hysteresis window to select a power supply according to an exemplary embodiment.

Referring to FIG. 5, in response to an envelope 17 being lower than or equal to a first level 61, an LPS is selected. When the envelope 17 may be higher than or equal to a second level 63, an SMPS is selected. The first level 61, the second level 63 exceeding the first level 61, and the detected envelope 17, are all illustrated in FIG. 5.

A power level of the envelope 17 becomes higher than the second level 63 at a time t1. Therefore, the SMPS is turned on. The power level of the envelope 17 becomes lower than the second level 63 at a time t2. Therefore, the SMPS is turned off.

The power level of the envelope 17 becomes lower than the first level 61 at a time t3. Therefore, the LPS is turned on. The power level of the envelope 17 becomes higher than the first level 61 at a time t4. Therefore, the LPS is turned off.

As described above, the SMPS is selected to be turned on in a section in which the power level of the envelope 17 is higher than the second level 63. The LPS is selected to be turned on in a section in which the power level of the envelope 17 is lower than the first level 61.

In this case, there is a dead time (or section) in which both of the LPS and the SMPS are not selected. The dead time refers to a time when no power supply is selected, and thus the amplifier 130 is not supplied with a power supply from the power supply 120. Therefore, the audio device 100 includes the smoother 170. As described above, the smoother 170 may be implemented as a capacitive element. The smoother 170 may accumulates charges for a time when power is supplied and then may supply power to the amplifier 130 by using the accumulated charges during the dead time.

Referring to FIG. 6, in response to a power level of an envelope 17 falling lower than or equal to a first level 61, an LPS is selected. In response to the power level of the envelope 17 rising to be higher than or equal to a second level 63, an SMPS is selected. The first level 61, the second level 63 exceeding the first level 61, and the detected envelope 17 are illustrated in FIG. 6.

The power level of the envelope 17 rises and then becomes higher than the second level 63 at a time t9. Therefore, the SMPS is turned on. In response to the SMPS being turned on, the SMPS is kept turned on until the power level of the envelope 17 becomes lower than the first level 61.

The power level of the envelope 17 falls and then becomes lower than the first level 61 at a time t10. Therefore, the LPS is turned on. Here, the SMPS is turned off. In response to the LPS being turned on, the LPS is kept turned on until the power level of the envelope 17 becomes higher than the second level 63. The power level of the envelope 17 rises and then becomes higher than the second level 63 at a time t11. Therefore, the SMPS is turned on, and the LPS is turned off.

In the exemplary embodiment described with reference to FIG. 6, there is no dead time as described with reference to FIG. 5. However, although there is no dead time as described with reference to FIG. 5. However, an instant dead time may occur according to changes of a power mode. Therefore, the smoother 170 may correspond to an instant power change according to changes of a power supply.

In order to prevent an instant dead time from occurring, the controller 150 may set an output voltage level of the LPS to the first level 61 at a time in response to a voltage level of the detected envelope falling to first level 61. The controller 150 set an output voltage level of the SMPS to the second level 63 at a time when the voltage level of the detected envelope rises to be the second level 63.

Figure 7:
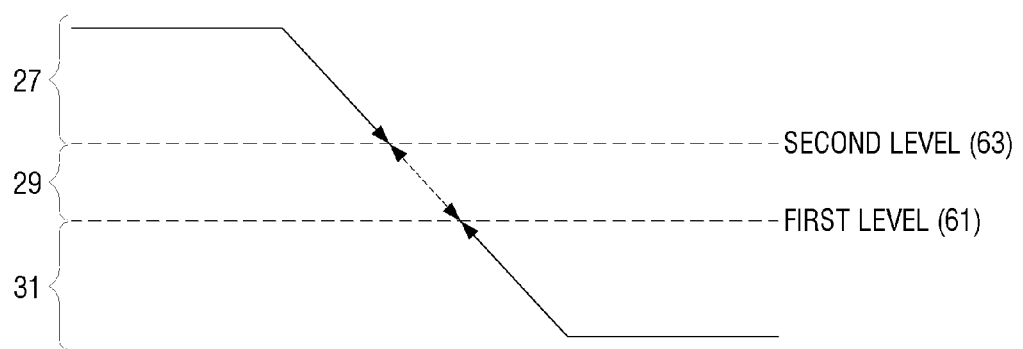
FIG. 7 is a view which illustrates a process of changing a power mode according to an exemplary embodiment.

FIG. 7 is a view which illustrates a method of changing a power mode according to an exemplary embodiment.

Referring to FIG. 7, a first level 61 and a second level 63 are illustrated. In the exemplary embodiment of FIG. 7, an SMPS operates an area 27 which is above the second level 63. An LPS operates an area 31 which is under the first level 61. A section between the first and second levels 61 and 63 is a dead time, i.e., an area 29 to which power is supplied by the smoother 170. As described above, in the exemplary embodiment of FIG. 7, an area in which power is supplied to the amplifier 130 may be divided into three areas.

Dead time may not exist. However, when the LPS and the SMPS are actually changed, power may not be supplied. Therefore, an area in which power is supplied to the amplifier 130 may be divided into three areas.

As described above, the power supply 120 adjusts a voltage level of a selected LPS or SMPS to a voltage level of a detected envelope and outputs the adjusted voltage level.

FIG. 8 is a flowchart which illustrates an output method of an audio device according to an exemplary embodiment.

Referring to FIG. 8, in operation S810, the audio device detects an envelope of an input audio signal. A change rate of the envelope may be set to be outside a visible frequency. The detected envelope may be used to select a power mode and to determine a power supply level.

In operation S820, the audio device compares a detected voltage level with a preset level to select one of an LPS and an SMPS and supply one of the LPS and the SMPS to an amplifier. The preset level may be set to one or more levels. In response to the detected voltage level being lower than or equal to the preset level, the audio device selects the LPS. In response to the detected voltage level being higher than or equal to the preset level, the audio device selects the SMPS.

In operation S830, the audio device amplifies the input audio signal. In operation S840, the audio device outputs the amplified audio signal.

The output method of the audio device according to the above-described various exemplary embodiments may be implemented as a program to be provided to the audio device.

For example, there may be provided a non-transitory computer-readable storage medium that stores a program executing a method of: detecting an envelope of an input audio signal; comparing a voltage level of the detected envelope with a preset level to select one of an LPS and an SMPS, and supplying one of the LPS and the SMPS to an amplifier; amplifying the input audio signal; and outputting the amplified audio signal.

The non-transitory computer-readable medium refers to a storage medium which does not store data for a short time such as a register, a cache memory, a memory, or the like, but rather semi-permanently stores data as a data structure and is readable by a device. In particular, the above-described applications or programs may be stored and provided on a non-transitory computer readable storage medium such as a CD, a DVD, a hard disk, a Blue-ray Disk™, a universal serial bus (USB), a memory card, a ROM, or the like.

The foregoing exemplary embodiments and advantages are merely exemplary and are not to be construed as limiting. The present teachings can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An audio device comprising:
   an envelope detector configured to detect an envelope of an input audio signal;
   a power supply which comprises a linear power supply (LPS) and a switching-mode power supply (SMPS);

an amplifier configured to amplify the input audio signal;
an output unit configured to output the audio signal amplified by the amplifier; and
a controller configured to compare a voltage level of the detected envelope with a first preset voltage level and a second preset voltage level, select one of the LPS and the SMPS based on a result of the comparison, and control the power supply to supply power from the selected one of the LPS and the SMPS to the amplifier,
wherein the second preset voltage level exceeds the first preset voltage level,
wherein the controller is further configured to select the LPS in response to the voltage level of the detected envelope falling to be lower than or equal to the first preset voltage level, select the SMPS in response to the voltage level of the detected envelope rising to be higher than or equal to the second preset voltage level, and set an output voltage level of the LPS to the first preset voltage level at a time when the voltage level of the detected envelope falls to the first preset voltage level, and set an output voltage level of the SMPS to the second preset voltage level at a time when the voltage level of the detected envelope rises to the second preset voltage level.

2. The audio device of claim 1, further comprising:
a smoother configured to smooth an instantaneous change of a voltage level caused by changes of the LPS and the SMPS.

3. The audio device of claim 1, further comprising:
a booster configured to boost the input audio signal.

4. The audio device of claim 1, wherein the power supply is configured to adjust a voltage level of the selected one of the LPS and the SMPS to the voltage level of the detected envelope and output the adjusted voltage level.

5. An output method of an audio device, the output method comprising:
detecting an envelope of an input audio signal;
comparing a voltage level of the detected envelope with a first preset voltage level and a second preset voltage level;
selecting one of a linear power supply (LPS) and a switching-mode power supply (SMPS) based on a result of the comparing;
amplifying the input audio signal by using power supplied by the selected one of the LPS and the SMPS; and
outputting the amplified audio signal,
wherein the second preset voltage level exceeds the first preset voltage level,
wherein the LPS is selected in response to the voltage level of the detected envelope falling to be lower than or equal to the first preset voltage level, and the SMPS is selected in response to the voltage level of the detected envelope rising to be higher than or equal to the second preset voltage level, and
wherein the selecting one of the LPS or the SMPS comprises:
setting an output voltage level of the LPS to the first preset voltage level at a time when the voltage level of the detected envelope falls to the first preset voltage level; and
setting to an output voltage level of the SMPS to the second preset voltage level at a time when the voltage level of the detected envelope rises to the second preset voltage level.

6. The output method of claim 5, further comprising:
smoothing an instantaneous change of a voltage level caused by changes of the LPS and the SMPS.

7. The output method of claim 5, further comprising:
boosting the input audio signal.

8. The output method of claim 5, further comprising:
adjusting a voltage level of the selected LPS or SMPS to the voltage level of the detected envelope,
wherein power is supplied to an amplifier on the adjusted voltage level to amplify the input audio signal.

* * * * *